US011463049B1

(12) United States Patent
Liu et al.

(10) Patent No.: US 11,463,049 B1
(45) Date of Patent: Oct. 4, 2022

(54) DIGITALLY MODULATED POLAR POWER AMPLIFIER

(71) Applicant: InPlay, Inc., Irvine, CA (US)

(72) Inventors: Ruifeng Liu, Irvine, CA (US); Russell Mohn, Santa Ana, CA (US)

(73) Assignee: INPLAY, INC., Irvine, CA (US)

( * ) Notice: Subject to any disclaimer, the term of this patent is extended or adjusted under 35 U.S.C. 154(b) by 0 days.

(21) Appl. No.: 17/303,293

(22) Filed: May 26, 2021

(51) Int. Cl.
*H03F 1/52* (2006.01)
*H03F 1/02* (2006.01)
*H03F 3/21* (2006.01)

(52) U.S. Cl.
CPC ............ *H03F 1/52* (2013.01); *H03F 1/0233* (2013.01); *H03F 3/21* (2013.01); *H03F 2200/105* (2013.01); *H03F 2200/426* (2013.01)

(58) Field of Classification Search
CPC . H03F 1/52; H03F 1/0233; H03F 3/21; H03F 2200/105; H03F 2200/426
USPC .................................. 330/298, 310–311, 277
See application file for complete search history.

(56) References Cited

U.S. PATENT DOCUMENTS

| | | | |
|---|---|---|---|
| 7,071,785 B2* | 7/2006 | Behzad ............. | H03F 1/22 330/311 |
| 2015/0054581 A1* | 2/2015 | Omid-Zohoor ....... | H03F 1/223 330/277 |

OTHER PUBLICATIONS

Presti et al., "A 25 dBm Digitally Modulated CMOS Power Amplifier for WCDMAEDGEOFDM With Adaptive Digital Predistortion and Efficiency Power Control", IEEE Journal of Solid-State Circuits, 2009.
Wong, et al., "A 1V 5mA Multimode IEEE 802.15.6 Bluetooth Low-Energy WBAN Transceiver for Biotelemetry Applications", IEEE Journal of Solid-State Circuits, 2012.

* cited by examiner

*Primary Examiner* — Hieu P Nguyen
(74) *Attorney, Agent, or Firm* — Innovation Capital Law Group, LLP; Vic Lin

(57) ABSTRACT

A digitally modulated polar power amplifier uses a thin-oxide amplifying transistor with a protection diode. The polar power includes a driver amplifier in a driver stage that can receive a phase-modulated signal with a constant envelope and amplify the signal for the output stage, which includes only a single thin-oxide transistor, leading to improved efficiency over systems that require a thick-oxide transistor. A protection diode can be added between the output of the polar power amplifier and the supply voltage to limit the output to the sum of the supply voltage plus the forward voltage of the diode. Amplitude modulation can be achieved through dynamically turning on and off the digital power amplifier via an amplitude control word (acw) input signal.

11 Claims, 4 Drawing Sheets

DIGITALLY MODULATED POLAR POWER AMPLIFIER

BACKGROUND OF THE INVENTION

1. Field of the Invention

Embodiments of the invention relate generally to power amplifiers. More particularly, embodiments of the invention relate to a digitally modulated polar power amplifier using a thin oxide amplifying transistor with a protection diode.

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

A linear transmitter power amplifier is usually used in linear modulation radio system with certain back-off to accommodate the peak-to-average power ratio (PAR) of the modulated data at the price of high power consumption. As modulation becomes more complex for higher data rates, a larger back-off is necessary, resulting in even worse efficiency.

To reduce the power consumption, a polar transmitter can be adopted where a nonlinear power amplifier is used. Another advantage of a polar transmitter is the smaller area compared with the linear counterpart. FIG. 1 shows the output stage of conventional polar power amplifier. Either a thick-oxide amplifying transistor or a thin-oxide amplifying transistor with a thick-oxide cascode transistor is used to guarantee reliability. To get certain on resistance, a thick-oxide transistor must have larger size, thus larger gate/drain capacitance, which results in higher power consumption. Similarly, the thick-oxide cascode transistor also has larger drain capacitance, and its channel resistance also consumes power.

In view of the foregoing, there is a need for a polar power amplifier using a thin oxide amplifying transistor.

SUMMARY OF THE INVENTION

Embodiments of the present invention provide a polar power amplifier comprising a driver amplifier receiving an input signal and outputting an amplified input signal; and an output stage receiving the amplified output signal, wherein the output stage includes only a single thin-oxide transistor providing a power amplifier output.

Embodiments of the present invention further provide a polar power amplifier comprising a driver amplifier receiving a phase-modulated input signal and outputting an amplified input signal; an output stage receiving the amplified output signal, wherein the output stage includes only a single thin-oxide transistor providing a power amplifier output; and a protection diode disposed between a supply voltage and the power amplifier output, wherein an output voltage of the power amplifier output is the sum of the forward voltage of the protection diode and the supply voltage.

Embodiments of the present invention also provide a method of amplifying a phase modulated input signal, comprising receiving the phase-modulated input signal in a driver amplifier and outputting an amplified input signal; receiving the amplified output signal at an output stage, wherein the output stage includes only a single thin-oxide transistor providing a power amplifier output; and limiting a voltage of the power amplifier output with a protection diode disposed between a supply voltage and the power amplifier output, wherein the limited voltage is the sum of the forward voltage of the protection diode and the supply voltage.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Figure 1:
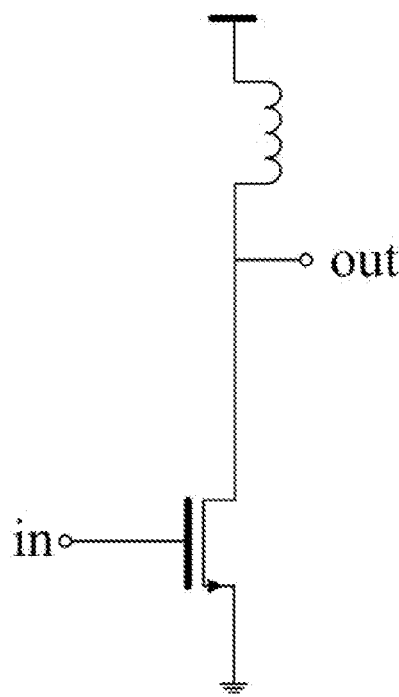
FIG. 1 illustrates a schematic representation of an output stage of conventional polar power amplifier using a thick-oxide transistor as the amplifying transistor according to the prior art.
Figure 2:
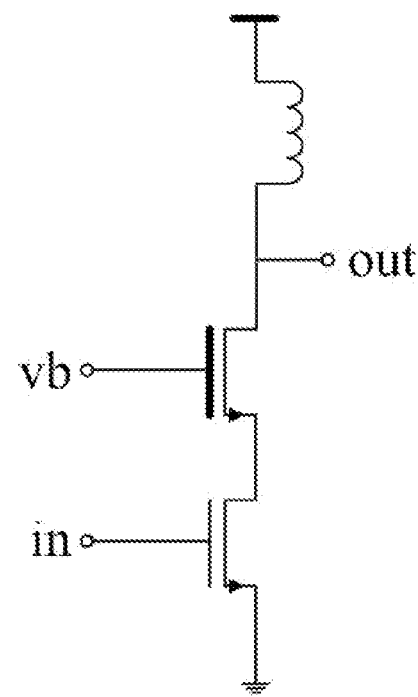
FIG. 2 illustrates a schematic representation of an output stage of conventional polar power amplifier using a thick-oxide transistor as a cascode transistor according to the prior art.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention and is not intended to limit the invention to the specific embodiments illustrated by the figures or description below.

As is well known to those skilled in the art, many careful considerations and compromises typically must be made when designing for the optimal configuration of a commercial implementation of any system, and in particular, the embodiments of the present invention. A commercial implementation in accordance with the spirit and teachings of the present invention may be configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

Broadly, embodiments of the present invention provide a digitally modulated polar power amplifier using a thin oxide amplifying transistor with a protection diode. The polar power includes a driver amplifier in the driver stage that can receive a phase-modulated signal with a constant envelope and amplify the signal for the output stage, which includes only a single thin-oxide transistor, leading to improved efficiency over systems that require a thick-oxide transistor. A protection diode can be added between the output of the polar power amplifier and the supply voltage to limit the output to the sum of the supply voltage plus the forward voltage of the diode. Amplitude modulation can be achieved through dynamically turning on and off the digital power amplifier via an amplitude control word (acw) input signal.

Figure 3:
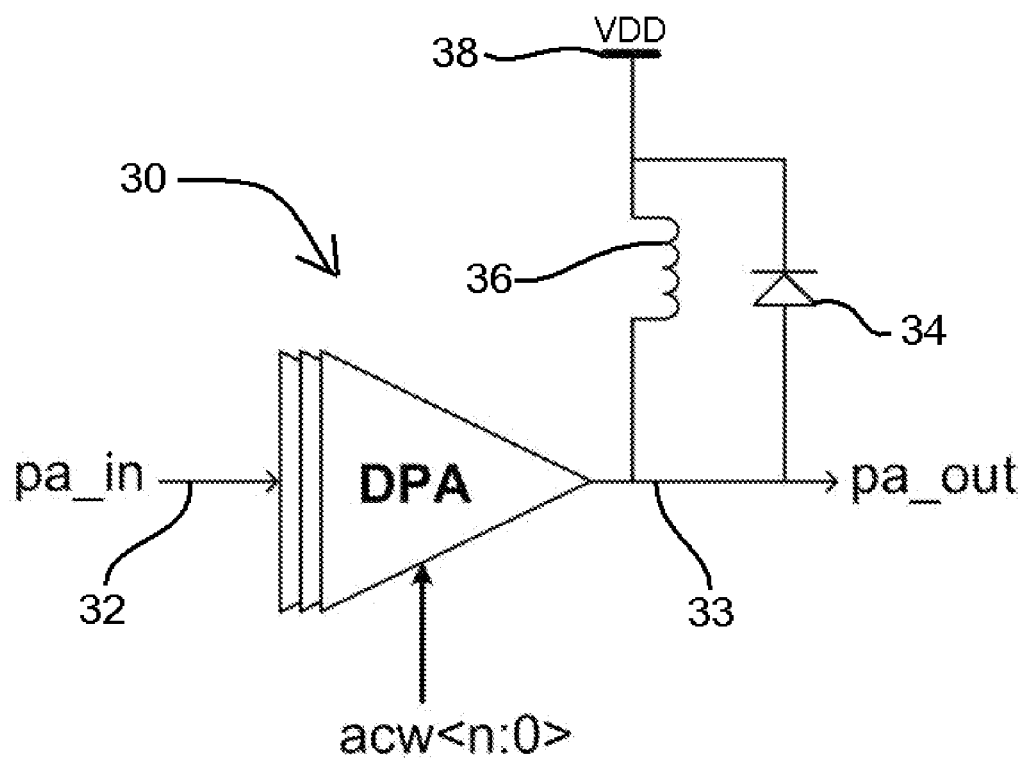
FIG. 3 illustrates a block diagram of a polar power amplifier according to an exemplary embodiment of the present invention.

Referring to FIG. 3, a digital polar power amplifier (DPA) 30 can receive an input 32 (pa_in), typically as a phase-modulated signal with a constant envelope. The output 33 of the DPA 30 can include a protection diode 34 and inductor 36 wired in parallel with the supply voltage 38 (VDD). As discussed in greater detail below, the protection diode 34 can help limit stress on the transistor in the output stage.

Figure 4:
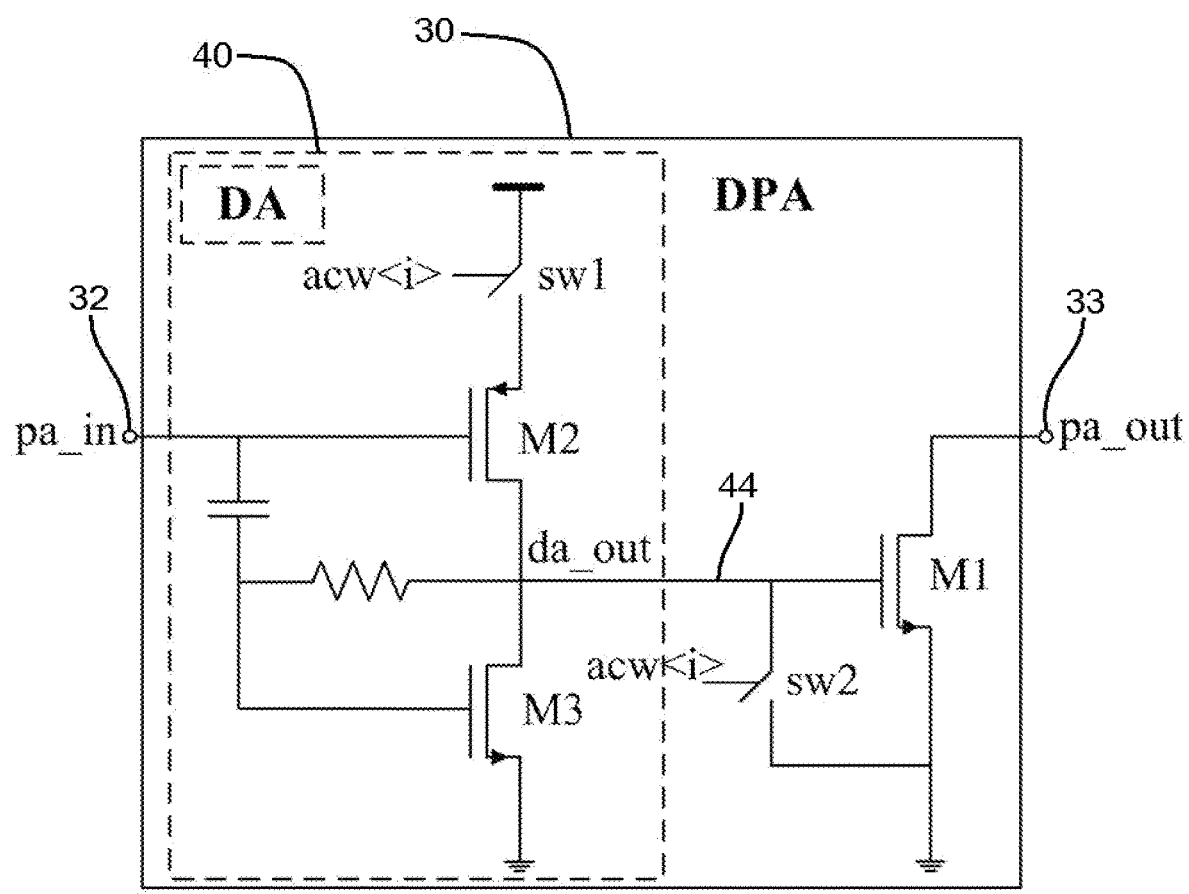
FIG. 4 illustrates a schematic representation of the polar power amplifier of FIG. 4.

Referring now to FIG. 4, the driver amplifier 40 of the DPA 30 can include transistors M2 and M3 for amplifying the input 32 (pa_in) to provide an output 44 (da_out) for the output stage. The output stage has only one thin-oxide transistor M1, which has smaller gate oxide capacitance and/or on resistance compared to a thick-oxide transistor, leading to better efficiency. To limit stress on M1, a protection diode is added between the power amplifier output 33 (pa_out) to the supply voltage VDD, which limits pa_out to VDD+VF, where VF is the forward voltage of the diode.

Amplitude modulation is accomplished through dynamically turning on/off the DPA cells by a digital amplitude control word (ACW) signal, acw<n:0>. For example, the digital ACW signal acw<n:0> can be an amplitude-contented (AM) signal in a polar transmitter, and therefore carries amplitude-related information. One or more output cells may be directly controlled by bit(s) of the digital ACW signal or may be controlled by control bit(s) derived from processing bit(s) of the digital ACW signal.

Referring to FIG. 4, when acw<i>='0', the switch sw1 is turned off, and sw2 is turned on, this $i^{th}$ DPA cell is disabled, where acw<i> is one bit of acw<n:0> ($0 \leq i \leq n$).

Figure 5:
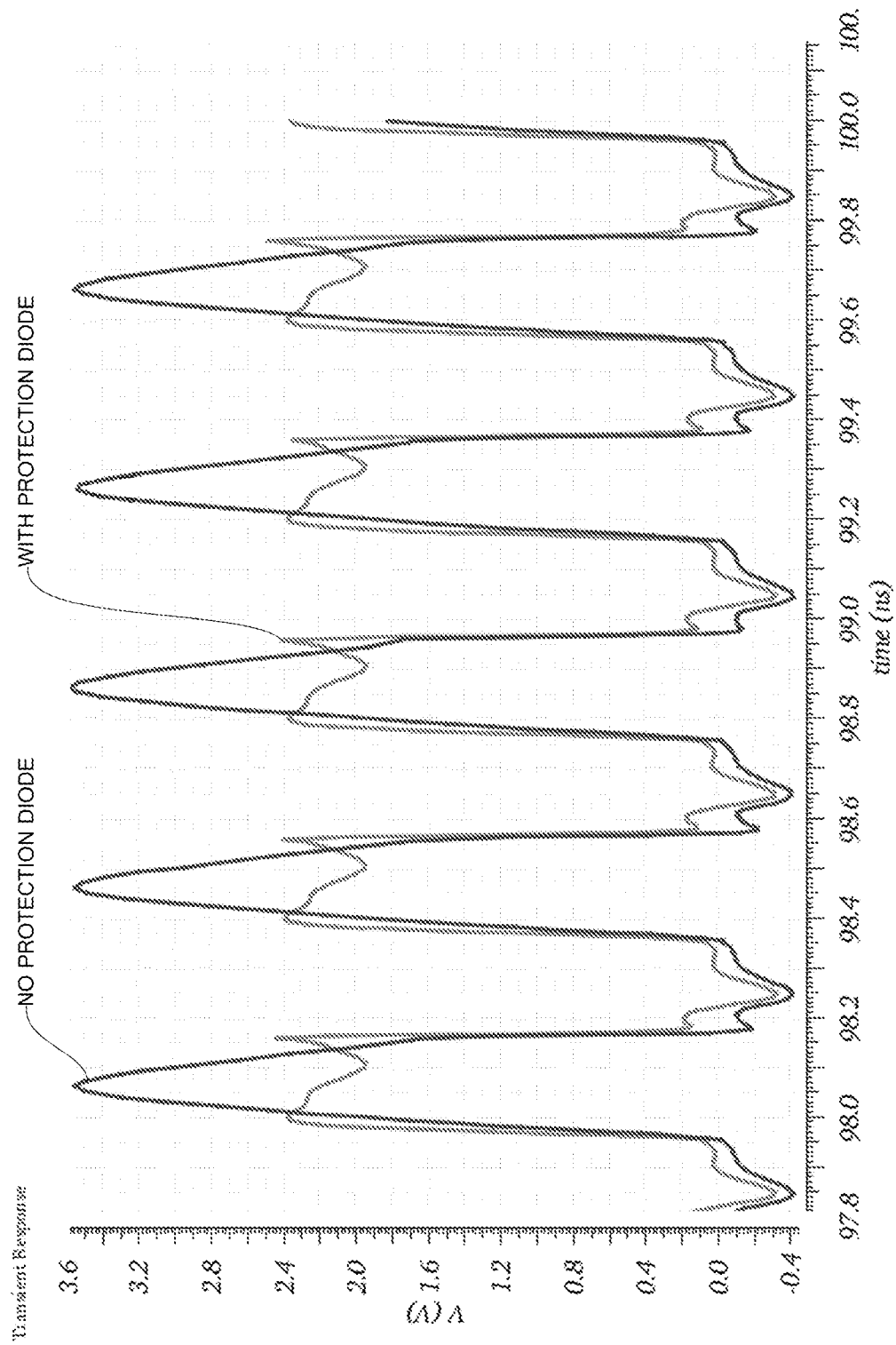
FIG. 5 illustrates an output of the polar power amplifier of FIG. 3, with and without a protection diode.

Referring now to FIG. 5, the waveform of pa_out is shown. As can be seen, pa_out is clamped within 2.4 V by the protection diode, whereas it exceeds 3V without the diode.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:
1. A polar power amplifier comprising:
   a driver amplifier receiving an input signal and outputting an amplified input signal;
   an output stage receiving the amplified output signal, wherein the output stage includes only a single thin-oxide transistor providing a power amplifier output; and a digital amplitude control word signal for controlling the driver amplifier, wherein amplitude modulation is provided by the amplitude control word.

2. The polar power amplifier of claim 1, wherein the power amplifier output is limited to a predetermined voltage.

3. The polar power amplifier of claim 2, further comprising a protection diode disposed between a supply voltage and the power amplifier output, wherein the predetermined voltage is the sum of the forward voltage of the protection diode and the supply voltage.

4. The polar power amplifier of claim 3, further comprising an inductor disposed in parallel with the protection diode.

5. The polar power amplifier of claim 1, wherein the input signal is a phase-modulated signal with a constant envelope.

6. A polar power amplifier comprising:
a driver amplifier receiving a phase-modulated input signal and outputting an amplified input signal;
an output stage receiving the amplified output signal, wherein the output stage includes only a single thin-oxide transistor providing a power amplifier output; and
a protection diode disposed between a supply voltage and the power amplifier output, wherein an output voltage of the power amplifier output is the sum of the forward voltage of the protection diode and the supply voltage.

7. The polar power amplifier of claim 6, further comprising an inductor disposed in parallel with the protection diode.

8. The polar power amplifier of claim 6, further comprising a digital amplitude control word signal for controlling the driver amplifier, wherein amplitude modulation is provided by the amplitude control word.

9. The polar power amplifier of claim 8, further comprising first and second transistors in the driving amplifier, wherein the first and second transistors are controlled by the digital amplitude control word.

10. A method of amplifying a phase modulated input signal, comprising:
receiving the phase-modulated input signal in a driver amplifier and outputting an amplified input signal;
receiving the amplified output signal at an output stage, wherein the output stage includes only a single thin-oxide transistor providing a power amplifier output; and
limiting a voltage of the power amplifier output with a protection diode disposed between a supply voltage and the power amplifier output, wherein the limited voltage is the sum of the forward voltage of the protection diode and the supply voltage.

11. The method of claim 10, further comprising controlling the driver amplifier with a digital amplitude control word signal, wherein amplitude modulation is provided by the amplitude control word.

* * * * *